(12) United States Patent
Chen et al.

(10) Patent No.: US 10,418,442 B1
(45) Date of Patent: Sep. 17, 2019

(54) TRENCH GATE MOSFET

(71) Applicant: UBIQ Semiconductor Corp., Hsinchu County (TW)

(72) Inventors: Chin-Fu Chen, Hsinchu County (TW); Yi-Yun Tsai, Hsinchu County (TW)

(73) Assignee: UBIQ Semiconductor Corp., Hsinchu County (TW)

( * ) Notice: Subject to any disclaimer, the term of this patent is extended or adjusted under 35 U.S.C. 154(b) by 0 days.

(21) Appl. No.: 16/040,542

(22) Filed: Jul. 20, 2018

(30) Foreign Application Priority Data

Feb. 23, 2018 (TW) .............................. 107106047 A

(51) Int. Cl.
*H01L 29/66* (2006.01)
*H01L 29/10* (2006.01)
*H01L 21/74* (2006.01)
*H01L 29/78* (2006.01)

(52) U.S. Cl.
CPC ........ *H01L 29/1087* (2013.01); *H01L 21/743* (2013.01); *H01L 29/66734* (2013.01); *H01L 29/7813* (2013.01)

(58) Field of Classification Search
CPC .................................................. H01L 29/7813
See application file for complete search history.

(56) References Cited

U.S. PATENT DOCUMENTS

| | | | |
|---|---|---|---|
| 6,605,862 B2 | 8/2003 | Van Dalen et al. | |
| 6,950,240 B2 | 9/2005 | Matsuo | |
| 7,323,386 B2 | 1/2008 | Yilmaz | |
| 7,405,452 B2 | 7/2008 | Yilmaz | |
| 7,427,800 B2 | 9/2008 | Yilmaz | |
| 7,855,415 B2 * | 12/2010 | Challa | H01L 21/3065 257/341 |
| 9,306,029 B2 * | 4/2016 | Fragapane | H01L 29/66348 |
| 2010/0044785 A1 * | 2/2010 | Murphy | H01L 29/7813 257/330 |
| 2017/0200799 A1 * | 7/2017 | Amali | H01L 29/407 |

* cited by examiner

*Primary Examiner* — Thao P Le
(74) *Attorney, Agent, or Firm* — JCIPRNET

(57) ABSTRACT

Provided is a trench gate MOSFET including a substrate of a first conductivity type, an epitaxial layer of the first conductivity type, a first conductive layer of a second conductivity type, a second conductive layer and an interlayer insulating layer. The epitaxial layer is disposed on the substrate and has at least one trench therein. The first conductive layer is disposed in the lower portion of the trench and in physical contact with the epitaxial layer. The second conductive layer is disposed in the upper portion of the trench. The interlayer insulating layer is disposed between the first conductive layer and the second conductive layer.

13 Claims, 13 Drawing Sheets

TRENCH GATE MOSFET

CROSS-REFERENCE TO RELATED APPLICATION

This application claims the priority benefit of Taiwan application serial no. 107106047, filed on Feb. 23, 2018. The entirety of the above-mentioned patent application is hereby incorporated by reference herein and made a part of this specification.

BACKGROUND OF THE INVENTION

Field of Invention

The present invention relates to a transistor and a method of manufacturing the same, and more particularly to a trench gate MOSFET and a method of manufacturing the same.

Description of Related Art

Power switch transistors are widely used in power switch elements such as power supplies, rectifiers, low voltage motor controllers or the like. In a conventional power switch transistor structure, a trench gate electrode includes a top electrode, a bottom electrode, and a thick oxide layer between the bottom electrode and the substrate. The potential lines at the bottom of the trench are dense, so a thick bottom oxide layer is required to prevent breakdown. Besides, in order to evenly distribute the potential lines at both sides of the trench, the oxide layer on the trench sidewall is required to have a certain thickness corresponding to an operating voltage for the device. The minimum thickness of this thick oxide layer has its limit to ensure the device performance, and thus, the minimum width of the trench is accordingly limited.

SUMMARY OF THE INVENTION

The present invention provides a trench gate MOSFET and a method of manufacturing the same, in which a thick oxide layer is not required to form in the trench, thereby effectively reducing the size of the trench and increasing the degree of integration of the device.

The present invention is to provide a trench gate MOSFET including a substrate of a first conductivity type, an epitaxial layer of the first conductivity type, a first conductive layer of a second conductivity type, a second conductive layer and an interlayer insulating layer. The epitaxial layer is disposed on the substrate and has at least one trench therein. The first conductive layer is disposed in the lower portion of the trench and in physical contact with the epitaxial layer. The second conductive layer is disposed in the upper portion of the trench. The interlayer insulating layer is disposed between the first conductive layer and the second conductive layer.

According to an embodiment of the present invention, the trench gate MOSFET further includes an insulating liner disposed between a sidewall of the first conductive layer and the epitaxial layer.

According to an embodiment of the present invention, the trench gate MOSFET further includes a metal layer disposed over the second conductive layer and electrically connected to the first conductive layer.

According to an embodiment of the present invention, the metal layer is electrically connected to the first conductive layer through a first contact plug located in the trench in an active area.

According to an embodiment of the present invention, the first contact plug has a strip shape, a block shape or a combination thereof.

According to an embodiment of the present invention, the second conductive layer is disposed on an upper sidewall of the trench and between the first contact plug and the upper sidewall.

According to an embodiment of the present invention, the trench gate MOSFET further includes a mask layer disposed between the second conductive layer and the first contact plug.

According to an embodiment of the present invention, the metal layer does not physically contact the first conductive layer in an active area.

According to an embodiment of the present invention, the metal layer is electrically connected to an upper part of the first conductive layer through a first contact plug in a termination area.

According to an embodiment of the present invention, the first contact plug has a strip shape, a block shape or a combination thereof According to an embodiment of the present invention, a doping concentration of the upper part of the first conductive layer is greater than a doping concentration of a lower part of the first conductive layer.

According to an embodiment of the present invention, the second conductive layer is disposed on an upper sidewall of the trench and surrounds the first conductive layer.

According to an embodiment of the present invention, the interlayer insulating layer is further disposed between the second conductive layer and the epitaxial layer.

According to an embodiment of the present invention, the trench gate MOSFET further includes a dielectric layer disposed between the second conductive layer and the epitaxial layer and between the second conductive layer and the interlayer insulating layer.

According to an embodiment of the present invention, a top width of the trench is substantially equal to a bottom width of the trench.

According to an embodiment of the present invention, a top width of the trench is greater than a bottom width of the trench.

Based on the above, in the trench gate MOSFET of the present invention, the bottom electrode (e.g., the first conductive layer) physically contacts the epitaxial layer, and the conductivity types of the bottom electrode and the epitaxial layer are opposite so as to form a PN junction at the bottom of the trench. In addition, the metal layer is electrically connected to the bottom electrode in the active area or in the termination area through the current dispersion structure (e.g., the first contact plug), so that the current can be effectively dispersed during operation of the device. In addition, there is no need to form a thick oxide layer on the bottom of the trench, which can effectively reduce the trench size and increase the degree of integration of the device.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings

DESCRIPTION OF EMBODIMENTS

Figure 1A:
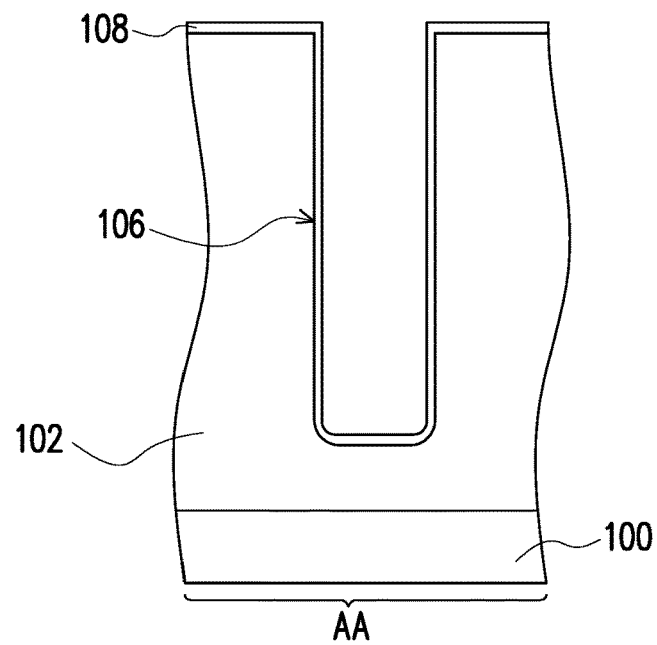
FIG. 1A to FIG. 1H are schematic cross-sectional views of a method of manufacturing a trench gate MOSFET according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1H are schematic cross-sectional views of a method of manufacturing a trench gate MOSFET according to an embodiment of the present invention.

Referring to FIG. 1A, an epitaxial layer 102 is formed on a substrate 100. In an embodiment, the substrate 100 is a semiconductor substrate of a first conductivity type, such as an N-type doped silicon substrate. In an embodiment, the epitaxial layer 102 is an epitaxial layer of the first conductivity type, such as an N-type doped epitaxial layer, and the forming method thereof includes performing an in-situ doping epitaxial process.

Thereafter, at least one trench 106 is formed in the epitaxial layer 102. In an embodiment, the trench 106 is located in the epitaxial layer 102 in an active area AA.

In an embodiment, a mask layer is formed on the epitaxial layer 102, and an etching process is performed to remove a portion of the epitaxial layer 102 by using the mask layer as a mask. The mask layer is then removed.

Next, an insulating material layer 108 is formed on the surface of the trench 106. More specifically, the insulating material layer 108 is formed on the top surface of the epitaxial layer 102 and on the sidewall and the bottom of the trench 106. In an embodiment, the insulating material layer 108 includes silicon oxide, and the forming method thereof includes performing a thermal oxidation process or a chemical vapour deposition (CVD) process.

Figure 1B:
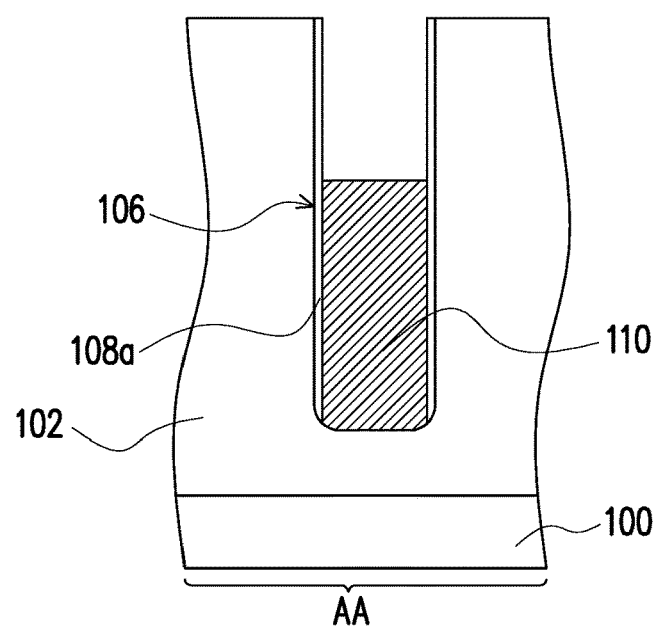

Referring to FIG. 1B, a portion of the insulating material layer 108 is removed to form an insulating liner 108a. In an embodiment, an anisotropic etching process is performed to remove the insulating material layer 108 on the top surface of the epitaxial layer 102 and on the bottom of the trench 106, leaving the insulating liner 108a on the sidewall of the trench 106. In an embodiment, the insulating liner 108a is provided in a spacer form. More specifically, the insulating liner 108a is formed on the sidewall of the trench 106 and exposes the bottom of the trench 106.

Afterwards, a first conductive layer 110 is formed in the lower portion of the trench 106. In an embodiment, the first conductive layer 110 is a conductive layer of a second conductivity type, such as a P-type conductive layer. In an embodiment, the method of forming the first conductive layer 110 includes forming a first conductive material layer on the epitaxial layer 102, and the first conductive material layer fills up the trench 106. The first conductive material layer includes undoped polysilicon, and the forming method thereof includes performing a chemical vapour deposition process. Thereafter, an etching back process is performed to remove a portion of the first conductive material layer. Then, an ion implantation process is performed to the remaining first conductive material layer.

Figure 1C:
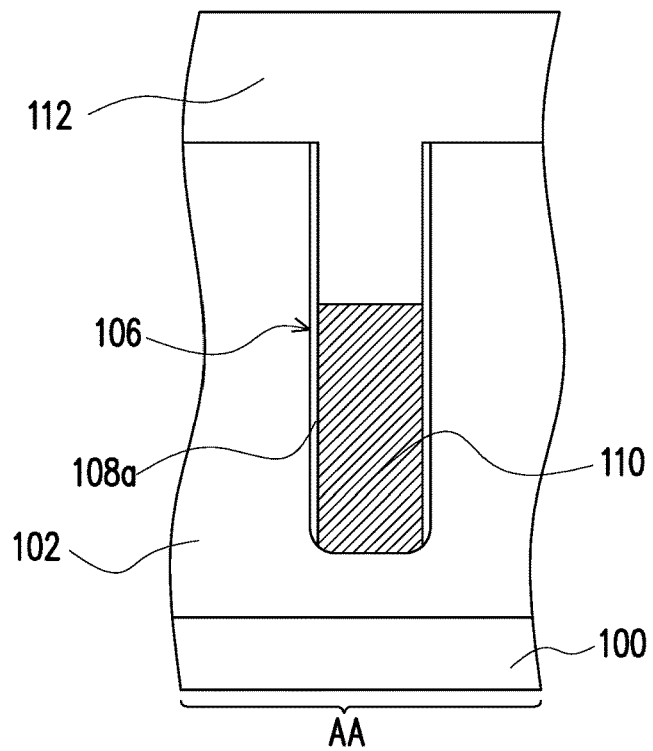
Figure 1D:
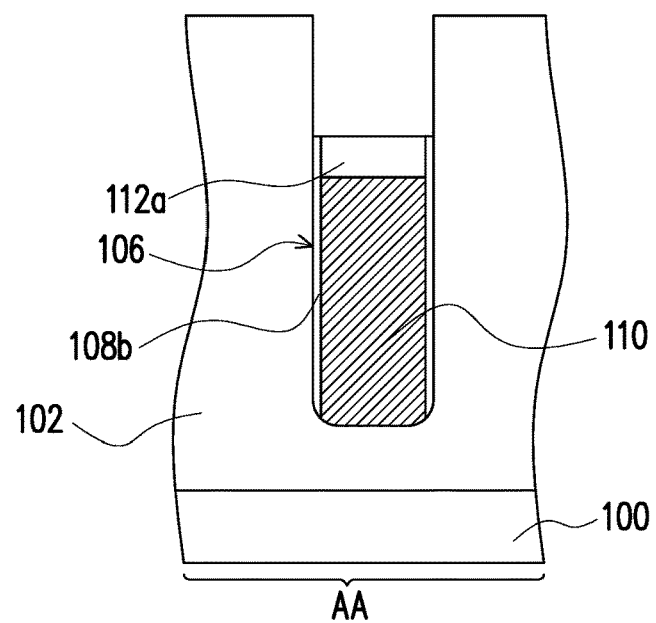

Referring to FIG. 1C and FIG. 1D, an interlayer insulating layer 112a is formed on the first conductive layer 110. In an embodiment, an insulating material layer 112 is formed on the epitaxial layer 102, and the insulating material layer 112 fills up the trench 106, as shown in FIG. 1C. In an embodiment, the insulating material layer 112 includes silicon oxide, and its formation method includes performing a chemical vapour deposition process.

Then, as shown in FIG. 1D, a portion of the insulating material layer 112 is removed to form the interlayer insulating layer 112a. In an embodiment, the method of removing the portion of the insulating material layer 112 includes performing an etching back process. In an embodiment, the removing step also removes a portion of the insulating liner 108a to form an insulating liner 108b. In an embodiment, a portion of the insulating liner 108b is disposed between the interlayer insulating layer 112a and the epitaxial layer 102.

Figure 1E:
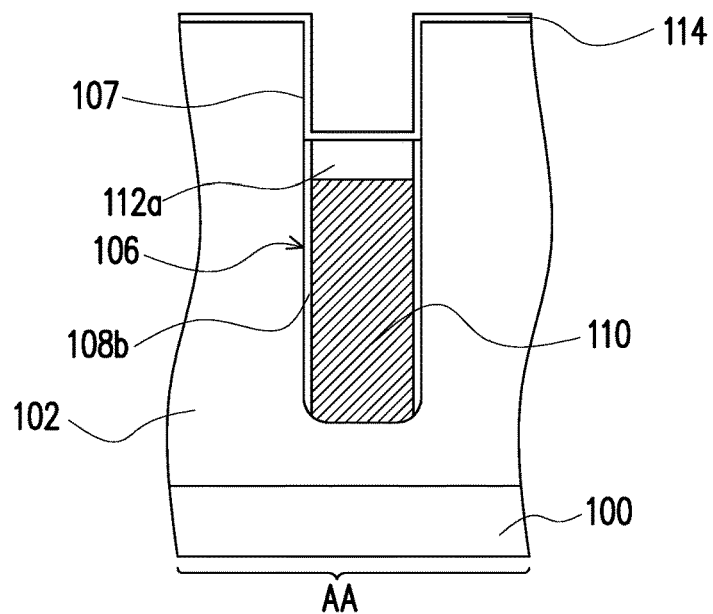

Referring to FIG. 1E, a dielectric layer 114 is formed on the interlayer insulating layer 112a. More specifically, the dielectric layer 114 covers the top surface of the epitaxial layer 102, the upper sidewall 107 of the trench 106, and the top surface of the interlayer insulating layer 112a. In an embodiment, the dielectric layer 114 includes silicon oxide, and its formation method includes performing a chemical vapour deposition process. In this embodiment, the dielectric layer 114 serves as a gate dielectric layer.

Figure 1F:
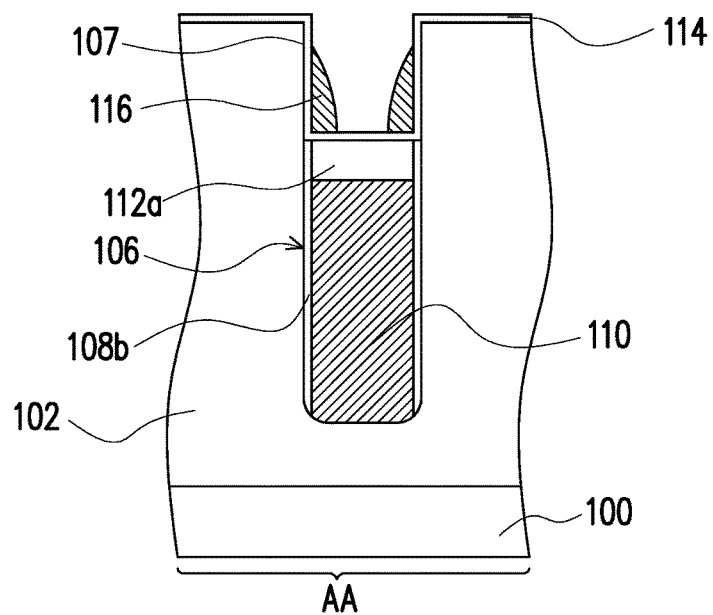

Referring to FIG. 1F, a second conductive layer 116 is formed on the dielectric layer 114. In an embodiment, the second conductive layer 116 is a conductive layer of the first conductivity type, such as an N-type conductive layer. In an embodiment, the method of forming the second conductive layer 116 includes forming a second conductive material layer on the dielectric layer 114. The second conductive material layer includes undoped polysilicon, and its formation method includes performing a chemical vapour deposition process. Next, an anisotropic etching process is performed to remove a portion of the second conductive material layer, leaving the second conductive layer 116 in the form of a spacer. Afterwards, an ion implantation process is performed to form an N-type heavily doped second conductive layer 116.

More specifically, the second conductive layer 116 is formed on the upper sidewall 107 of the trench 106 and exposes a portion of the dielectric layer 114 on the interlayer insulating layer 112a. In an embodiment, the second conductive layer 116 has a sloped sidewall or an upwardly tapering profile. In another embodiment, the second conductive layer 116 has an inclined upper sidewall and a substantially vertical lower sidewall.

Figure 1G:
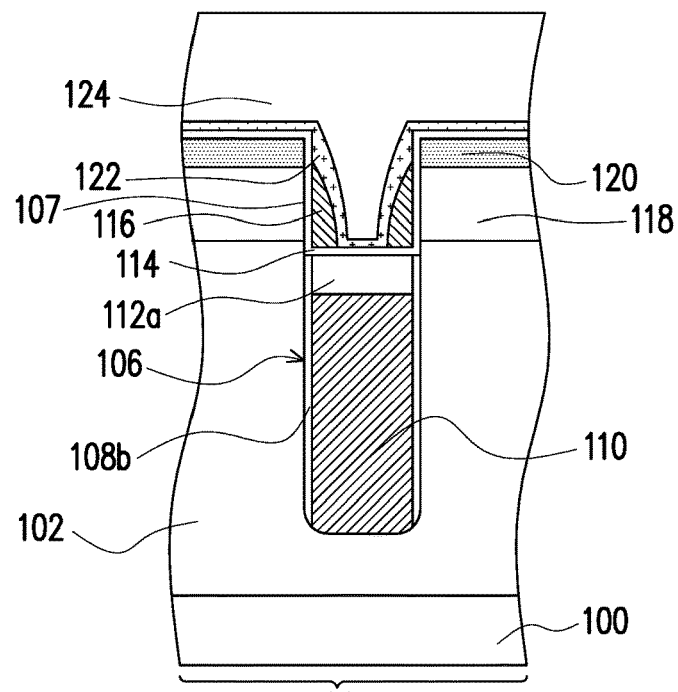

Referring to FIG. 1G, a body layer 118 is formed in the epitaxial layer 102. In an embodiment, the body layer 118 is a body layer of the second conductivity type, such as a P-type body layer, and its formation method includes performing an ion implantation process.

Thereafter, a doped region 120 is formed in the body layer 118. In an embodiment, the doped region 120 is a doped region of the first conductivity type, such as an N-type heavily doped region, and its formation method includes performing an ion implantation process.

Next, a mask layer 122 is formed on the dielectric layer 114 and the second conductive layer 116. In an embodiment, the mask layer 122 includes silicon nitride, and its formation method includes performing a chemical vapour deposition process.

Following this, a dielectric layer 124 is formed on the mask layer 122. In an embodiment, the dielectric layer 124 includes silicon oxide, borophosphosilicate glass (BPSG), phosphosilicate glass (PSG), fluorosilicate glass (FSG) or undoped silicate glass (USG), and its formation method includes performing a chemical vapour deposition process.

Figure 1H:
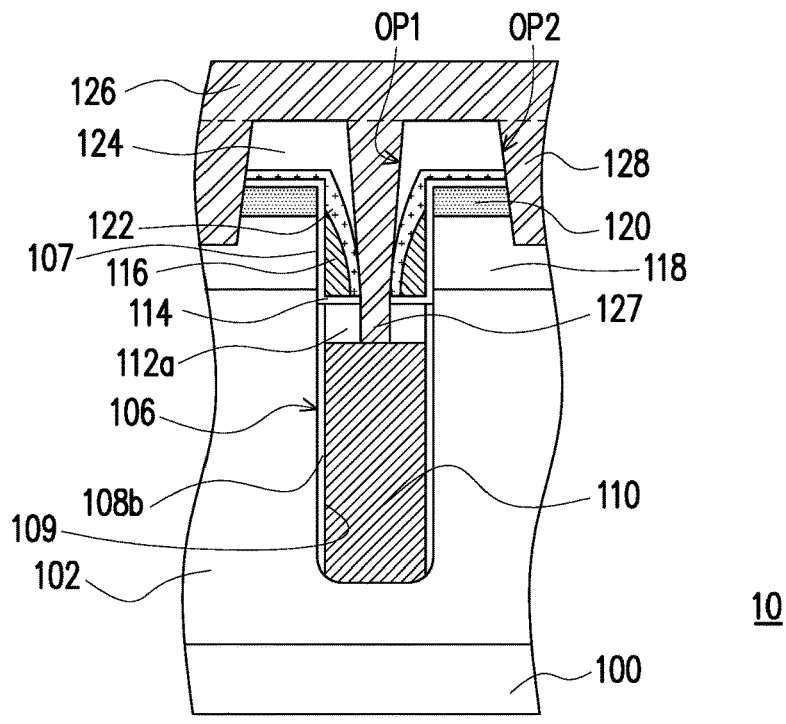

Referring to FIG. 1H, a first opening OP1 is formed through the dielectric layer 124, the mask layer 122, the dielectric layer 114 and the interlayer insulating layer 112a, and a second opening OP2 is formed through the dielectric layer 124, the mask layer 122, the dielectric layer 114 and the doped region 120. The method of forming the openings includes performing photolithography etching processes. In an embodiment, upon the process requirements, the shape of each of the first opening OP1 and the second opening OP2 may include a strip shape, a block shape or a combination thereof.

Afterwards, a metal layer 126 is formed on the dielectric layer 124, and the metal layer 126 is filled in the first opening OP1 and the second opening OP2. Part of the metal layer 126 filled in the first opening OP1 constitutes a first contact plug 127, and part of the metal layer 126 filled in the second opening OP2 constitutes a second contact plug 128. The trench gate MOSFET 10 of the present invention is thus completed.

In the trench gate MOSFET 10 of the present invention, the first conductive layer 110 is in physical contact with the epitaxial layer 102, and the conductivity types of the first conductive layer 110 and the epitaxial layer 102 are opposite so as to form a PN junction at the bottom of the trench 106. In addition, the metal layer 126 is electrically connected to the first conductive layer 110 through the first contact plug 127 (which can be regarded as a current dispersion structure) in the active area AA, so that the current can be effectively dispersed during operation of the device.

In the above embodiments, the first contact plug 127 as a current dispersion structure is provided in the active area AA and in direct contact with the first conductive layer 110 and the metal layer 126 to achieve current dispersion, but the present invention is not limited thereto. In another embodiment, the current dispersion structure can also be designed in the termination area depending on the process needs.

FIG. 2A to FIG. 2H are schematic cross-sectional views of another method of manufacturing a trench gate MOSFET according to an embodiment of the present invention. FIG. 3 is a schematic perspective view of a trench gate MOSFET depicted in FIG. 2.

Figure 2A:
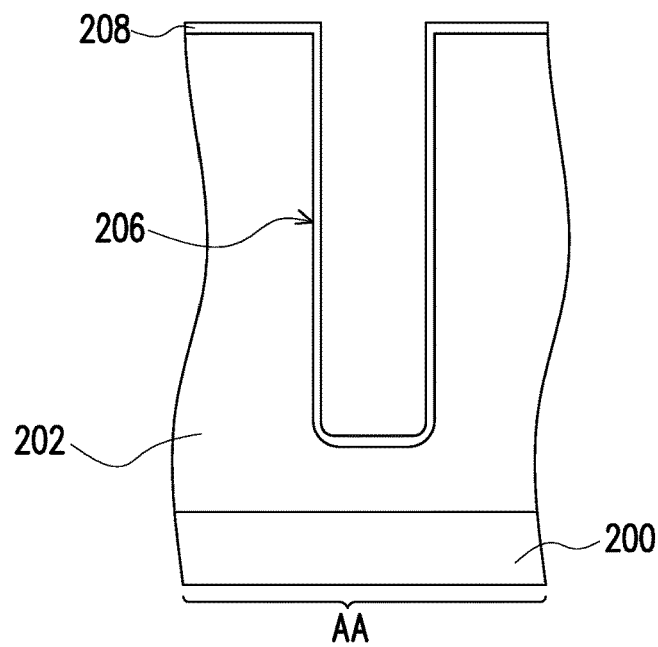
FIG. 2A to FIG. 2H are schematic cross-sectional views of a method of manufacturing a trench gate MOSFET according to another embodiment of the present invention.
Figure 3:
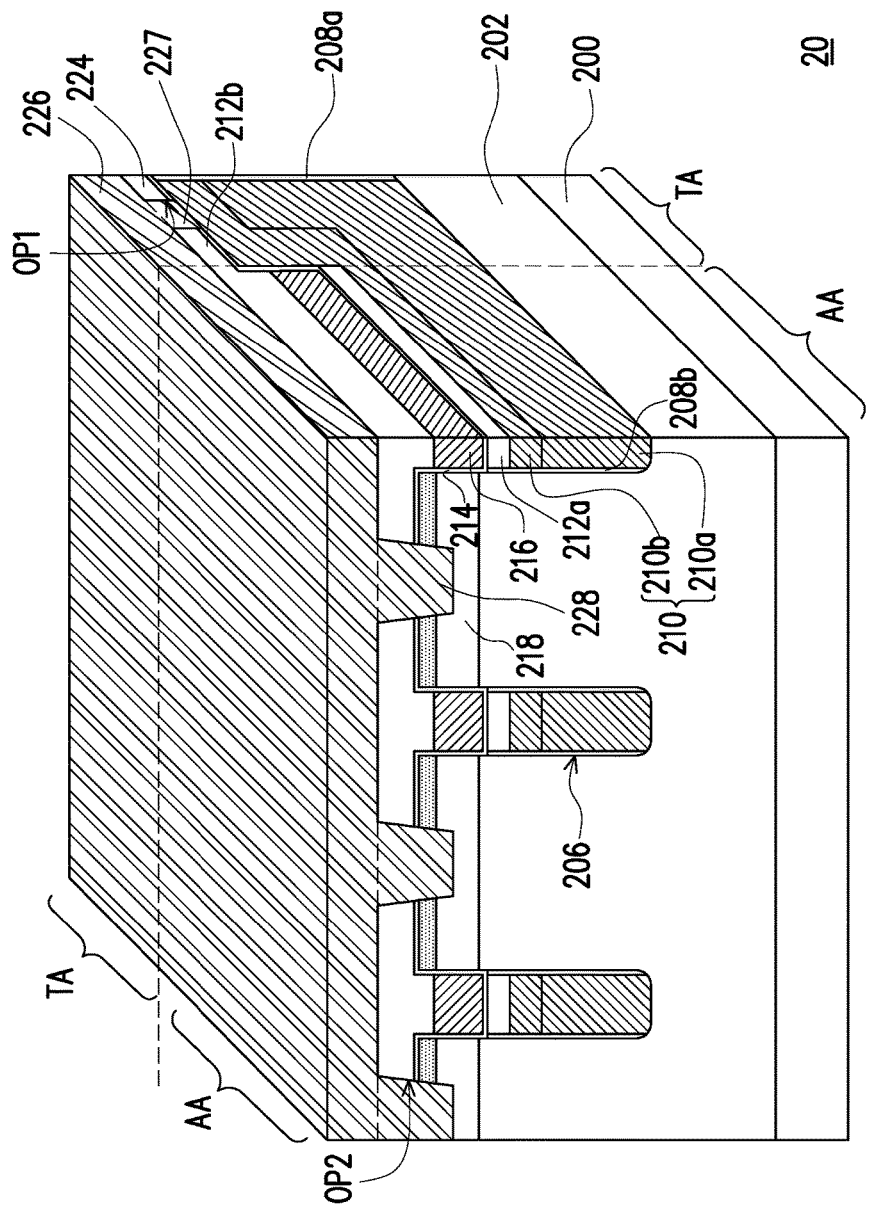
FIG. 3 is a schematic perspective view of a trench gate MOSFET according to another embodiment of the present invention.

Referring to FIG. 2A, an epitaxial layer 202 is formed on a substrate 200. In an embodiment, the substrate 200 is a semiconducting substrate of a first conductivity type, such as an N-type heavily doped silicon substrate. In an embodiment, the epitaxial layer 202 is an epitaxial layer of the first conductivity type, such as an N-type lightly doped epitaxial layer. Next, at least one trench 206 is formed in the epitaxial layer 202. More specifically, the trenches 206 are located in the epitaxial layer 202 in the active area AA and in the termination area TA, as shown in the perspective view of FIG. 3.

Thereafter, an insulating material layer 208 is formed on the surface of the trench 206. More specifically, the insulating material layer 208 is formed on the top surface of the epitaxial layer 202 and on the sidewall and the bottom of the trench 206. In an embodiment, the insulating material layer 208 includes silicon oxide, and its formation method includes performing a thermal oxidation process or a chemical vapour deposition process.

Figure 2B:
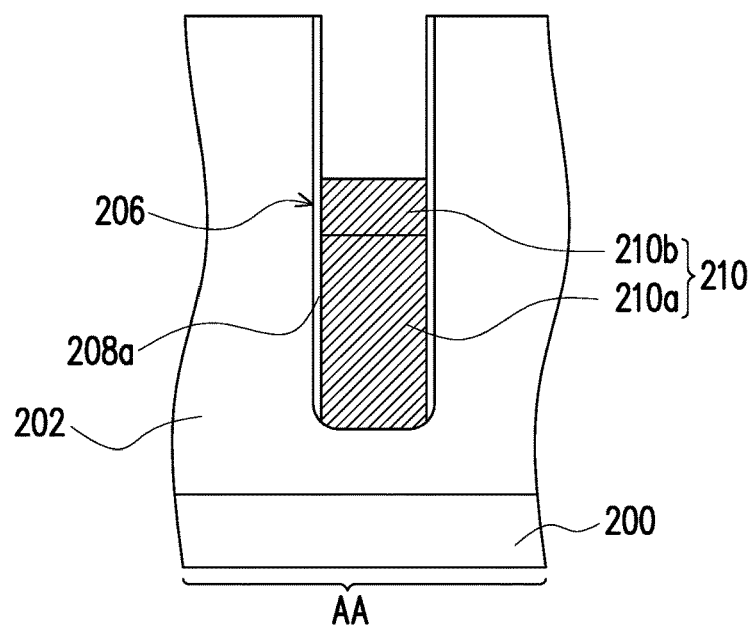

Referring to FIG. 2B, a portion of the insulating material layer 208 is removed to form an insulating liner 208a in the form of a spacer. In an embodiment, the method of removing the portion of the insulating material layer 208 includes performing an anisotropic etching process. More specifically, the insulating liner 208a is formed on the sidewall of the trench 206 and exposes the bottom of the trench 206.

Next, a first conductive layer 210 is formed in the lower portion of the trench 206 in t active area AA. In an embodiment, the first conductive layer 210 is a conductive layer of a second conductivity type, such as a P-type conductive layer. In an embodiment, the first conductive layer 210 is formed to include a lower part 210a and an upper part 210b, and the doping concentration of the upper part 210b is greater than the doping concentration of the lower part 210a.

In an embodiment, the method of forming the first conductive layer 210 includes forming a first conductive material layer on the epitaxial layer 202, and the first conductive material layer fills up the trench 206. The first conductive material layer includes undoped polysilicon, and its formation method includes performing a chemical vapour deposition process. Thereafter, a first etching back process is performed to remove the first conductive material layer outside the trench 206. Next, a second etching back process is performed to remove the first conductive material layer in the active area AA, so that the height of the first conductive layer in the active area AA is lower than the height of the first conductive layer in the termination area TA, as shown in the perspective view of FIG. 3. Then, a first ion implantation process and a second ion implantation process with different doping doses are performed to form a P-type heavily doped upper part 210b and a P-type lightly doped lower part 210a.

Figure 2C:
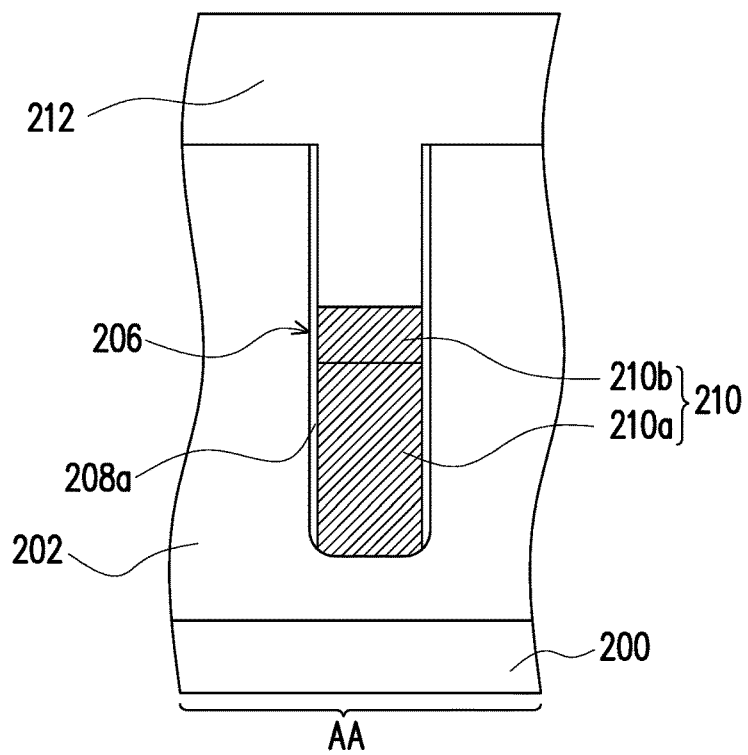
Figure 2D:
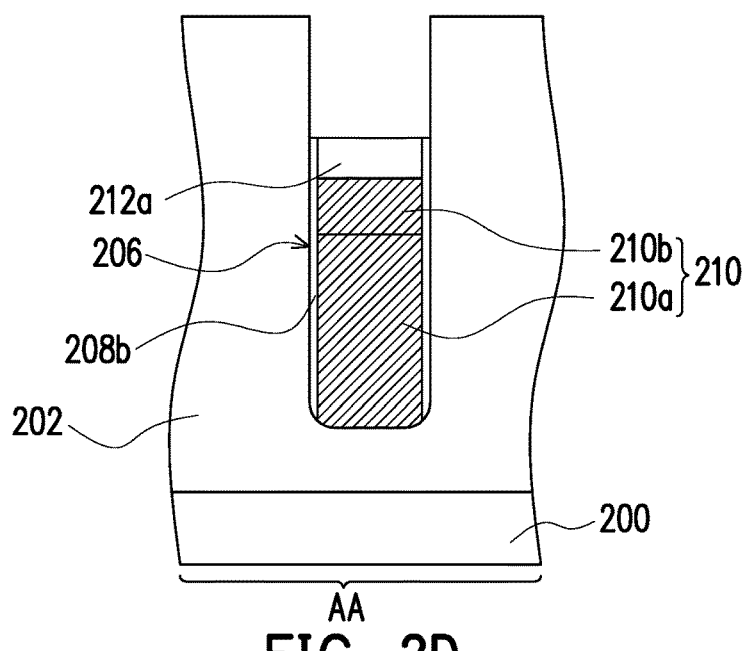

Referring to FIG. 2C and FIG. 2D, an interlayer insulating layer 212a is formed on the first conductive layer 210. In an embodiment, an insulating material layer 212 is formed on the epitaxial layer 202, and the insulating material layer 212 fills up the trench 206, as shown in FIG. 2C. In an embodiment, the insulating material layer 212 includes silicon oxide, and its formation method includes performing a chemical vapour deposition process.

Then, as shown in FIG. 2D, a portion of the insulating material layer 212 in the active area AA is removed to form the interlayer insulating layer 212a. In this removing step, the insulating layer 212 in the termination area TA is completely removed, as shown in the perspective view of FIG. 3. In an embodiment, the method of removing the portion of the insulating material layer 212 includes performing an etching back process. In an embodiment, the removing step also removes a portion of the insulating liner 208a in the active area AA to form an insulating liner 208b. In an embodiment, a portion of the insulating liner 208b is disposed between the interlayer insulating layer 212a and the epitaxial layer 202 in the active area AA.

Figure 2E:
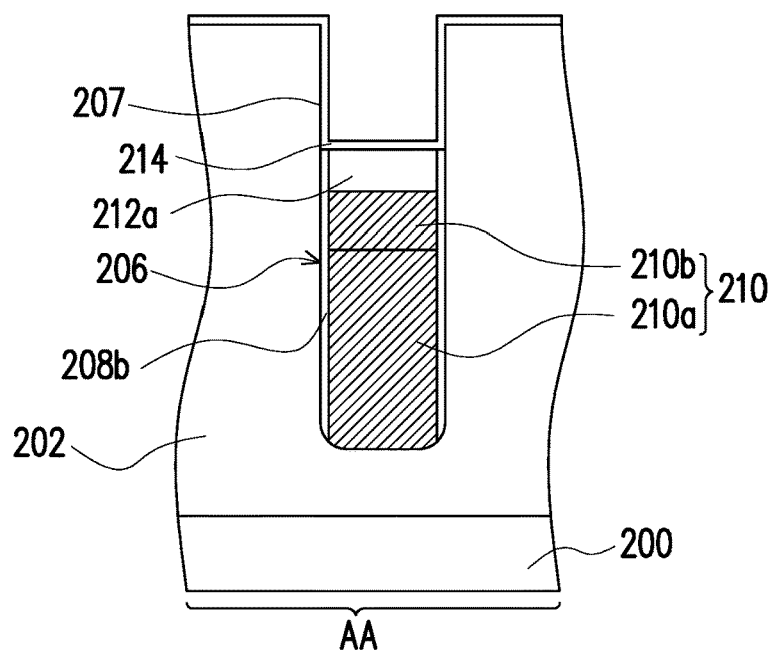

Referring to FIG. 2E, a dielectric layer 214 is formed on the interlayer insulating layer 212a. More specifically, the dielectric layer 214 covers the top surface of the epitaxial layer 102, the upper sidewall 207 of the trench 206, and the top surface of the interlayer insulating layer 212a. In an embodiment, the dielectric layer 214 includes silicon oxide, and its formation method includes performing a chemical vapour deposition process. In this embodiment, the dielectric layer 214 serves as a gate dielectric layer.

Figure 2F:
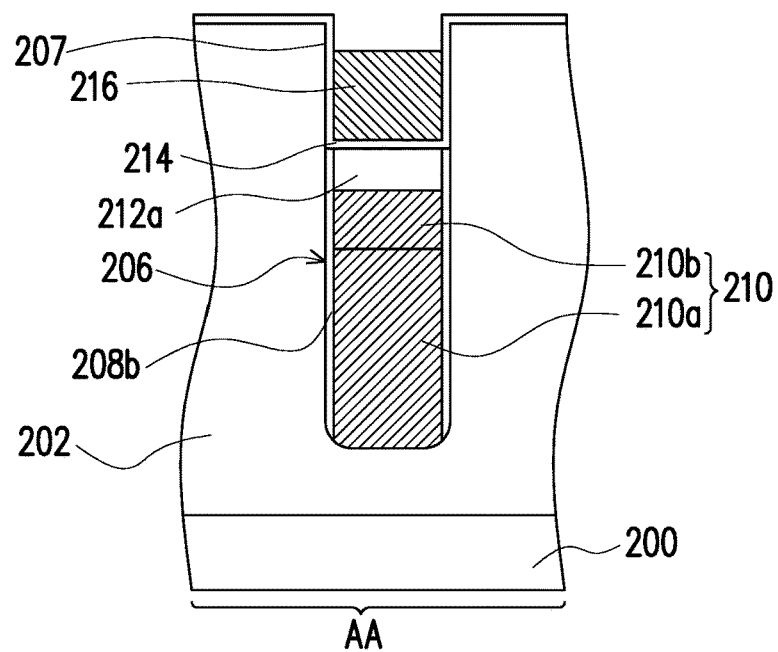

Referring to FIG. 2F, a second conductive layer 216 is formed on the dielectric layer 214 in the active area AA. In an embodiment, the second conductive layer 216 is a conductive layer of the first conductivity type, such as an N-type conductive layer. In an embodiment, the method of forming the second conductive layer 216 includes forming a second conductive material layer on the epitaxial layer 202, and the second conductive material layer fills up the trench 206. The second conductive material layer includes undoped polysilicon, and its formation method includes performing a chemical vapour deposition process. Then, a first etching back process is performed to remove the second conductive material layer outside the trench 206. In the first etching back process, the second conductive material layer in the termination area TA is completely removed, as shown in the perspective view of FIG. 3. Then, a second etching back process is performed to remove a portion of the second conductive material layer in the active area AA. Afterwards, an ion implantation process is performed to form an N-type heavily doped second conductive layer 216.

Figure 2G:
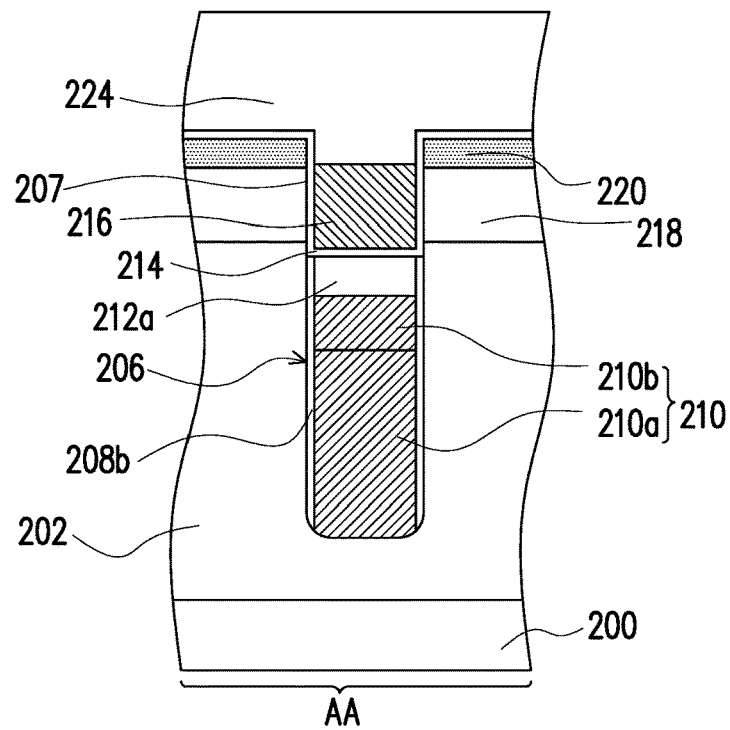

Referring to FIG. 2G, a body layer 218 is formed in the epitaxial layer 202. In an embodiment, the body layer 218 is a body layer of the second conductivity type, such as a P-type body layer, and its formation method includes performing an ion implantation process.

Thereafter, a doped region 220 is formed in the body layer 218. In an embodiment, the doped region 220 is a doped region of the first conductivity type, such as an N-type heavily doped region, and its formation method includes performing an ion implantation process.

Then, a dielectric layer 224 is formed on the dielectric layer 214 and the second conductive layer 216. In an embodiment, the dielectric layer 224 includes silicon oxide, borophosphosilicate glass (BPSG), phosphosilicate glass (PSG), fluorosilicate glass (FSG) or undoped silicate glass (USG), and its formation method includes performing a chemical vapour deposition process.

Figure 2H:
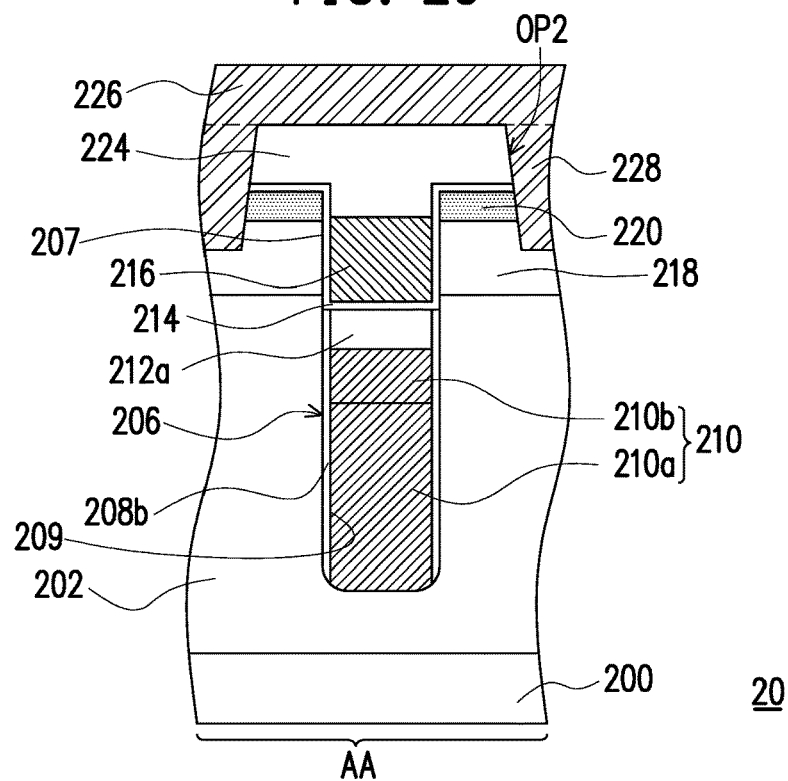

Referring to FIG. 2H, a first opening OP1 is formed through the dielectric layer 224 and the dielectric layer 214, and a second opening OP2 is formed through the dielectric layer 224, the dielectric layer 214 and the doped region 220. In this embodiment, the first opening OP1 is located in the termination area TA, and the second opening OP2 is located in the active area AA, as shown in the perspective view of FIG. 3. The method of forming the openings includes performing photolithography etching processes. In an embodiment, upon the process requirements, the shape of each of the first opening OP1 and the second opening OP2 may include a strip shape, a block shape or a combination thereof.

Afterwards, a metal layer 226 is formed on the dielectric layer 224, and the metal layer 226 is filled in the first opening OP1 and the second opening OP2. Part of the metal layer 226 filled in the first opening OP1 constitutes a first contact plug 227, and part of the metal layer 226 filled in the second opening OP2 constitutes a second contact plug 228. The trench gate MOSFET 20 of the present invention is thus completed.

In the above-mentioned embodiment, the first contact plug 227 as a current dispersion structure is provided in the termination area TA and in direct contact with the first conductive layer 210 and the metal layer 226 to achieve current dispersion.

FIG. 4A to FIG. 4G are schematic cross-sectional views of a method of manufacturing a trench gate MOSFET according to another embodiment of the present invention.

Figure 4A:
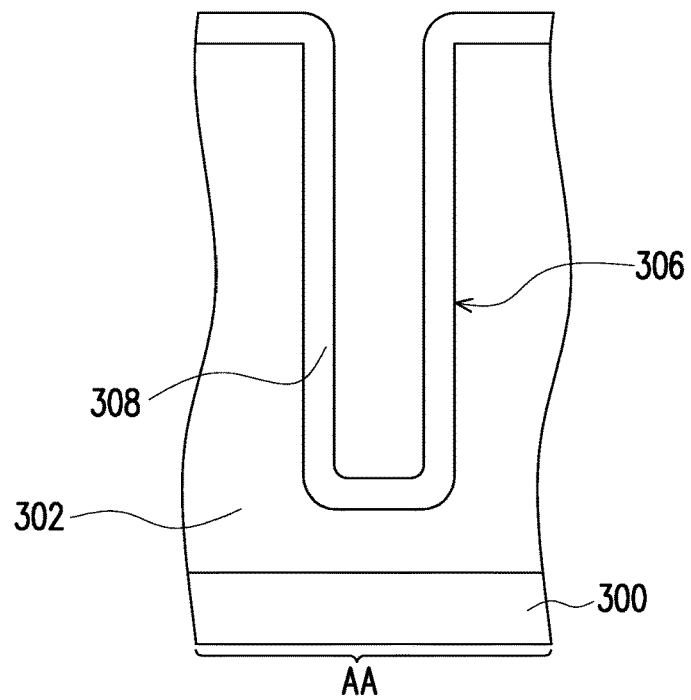
FIG. 4A to FIG. 4G are schematic cross-sectional views of a method of manufacturing a trench gate MOSFET according to another embodiment of the present invention.

Referring to FIG. 4A, an epitaxial layer 302 is formed on a substrate 300. In an embodiment, the substrate 300 is a semiconducting substrate of a first conductivity type, such as an N-type heavily doped silicon substrate. In an embodiment, the epitaxial layer 302 is an epitaxial layer of the first conductivity type, such as an N-type lightly doped epitaxial layer. Next, at least one trench 306 is formed in the epitaxial layer 302. More specifically, the trench 306 is located in the epitaxial layer 302 in an active area AA.

Next, an insulating material layer 308 is formed on the surface of the trench 306. More specifically, the insulating material layer 308 is formed on the top surface of the epitaxial layer 302, the sidewall and the bottom of the trench 306. In an embodiment, the insulating material layer 308 includes silicon oxide, and its formation method includes performing a thermal oxidation process or a chemical vapour deposition process.

Afterwards, a first conductive layer 310 is formed in the trench 306. In an embodiment, the first conductive layer 310 is a conductive layer of a second conductivity type, such as a P-type conductive layer. In an embodiment, the method of forming the first conductive layer 310 includes forming a first conductive material layer on the epitaxial layer 302, and the first conductive material layer fills up the trench 306. The first conductive material layer includes undoped polysilicon, and its formation method includes performing a chemical vapour deposition process. Next, an etching back process is performed to remove the first conductive material layer outside the trench 306. Then, an ion implantation process is performed to the remaining first conductive material layer.

Figure 4B:
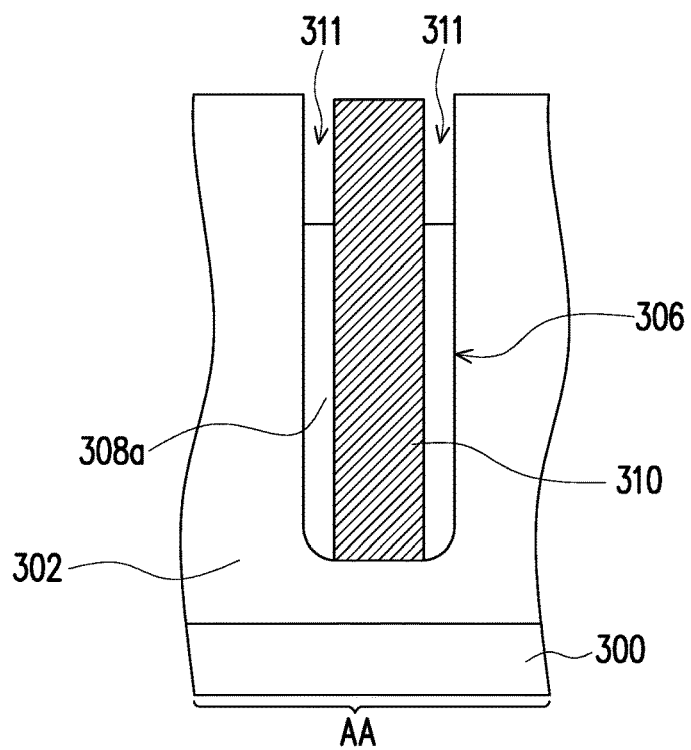

Referring to FIG. 4B, a portion of the insulating material layer 308 is removed to form an opening 311 around the first conductive layer 310. The remaining insulating material layer 308 is referred to as an insulating liner 308a disposed between the lower portion of the first conductive layer 310 and the epitaxial layer 302. In an embodiment, the opening 311 exposes the upper portion of the first conductive layer 310 and the top surface of the insulating liner 308a. In an embodiment, the opening 311 has a substantially vertical sidewall. In an embodiment, the method of removing the portion of the insulating material layer 308 includes performing an etching back process.

Figure 4C:
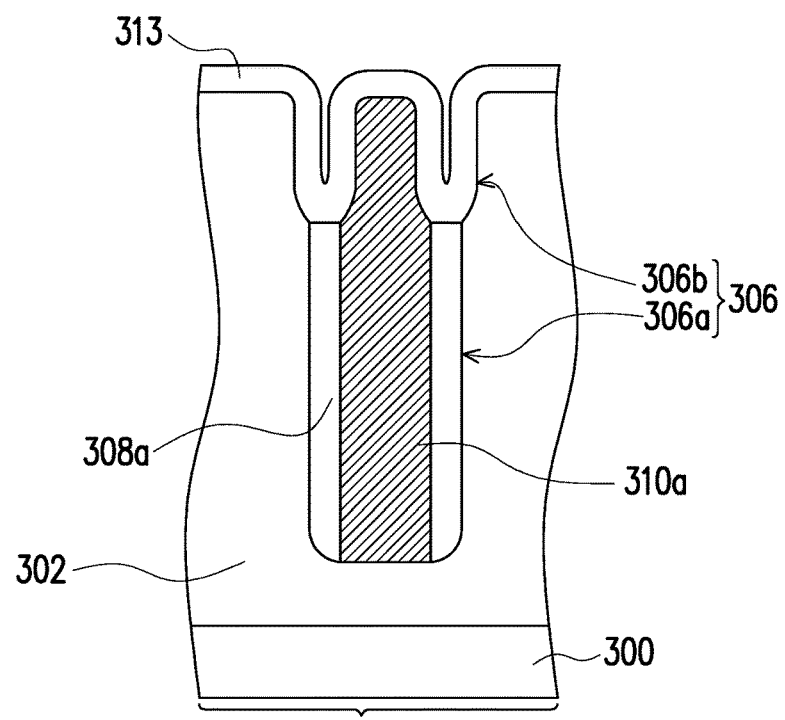
Figure 4D:
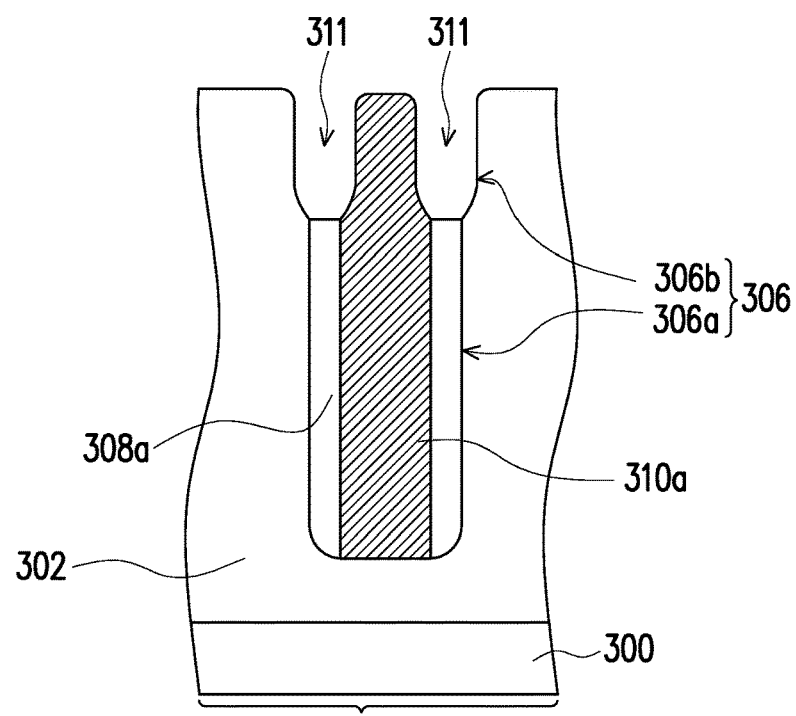

Referring to FIG. 4C and FIG. 4D, the opening 311 is widened. In an embodiment, a sacrificial insulating layer 313 is formed on the surface of the opening 311, and the sacrificial insulating layer 313 covers the upper portion of the first conductive layer 310, as shown in FIG. 4C. In an embodiment, the sacrificial insulating layer 313 includes silicon oxide, and its formation method includes performing a thermal oxidation process. In an embodiment, the thermal oxidation process also consumes a portion of the first conductive layer 310 to form a first conductive layer 310a with a narrow top and a wide bottom. Next, the sacrificial insulating layer 313 is removed, as shown in FIG. 4D. In an embodiment, the method of removing the sacrificial insulating layer 313 includes performing an etching process. In an embodiment, the widened opening 311 has an arc sidewall. In an embodiment, the trench 306 includes a lower trench 306a and an upper trench 306b, and the width of the upper trench 306b is greater than the width of the lower trench 306a. In addition, the upper trench 306b has an arc sidewall, and lower trench 306a has a substantially vertical sidewall.

Figure 4E:
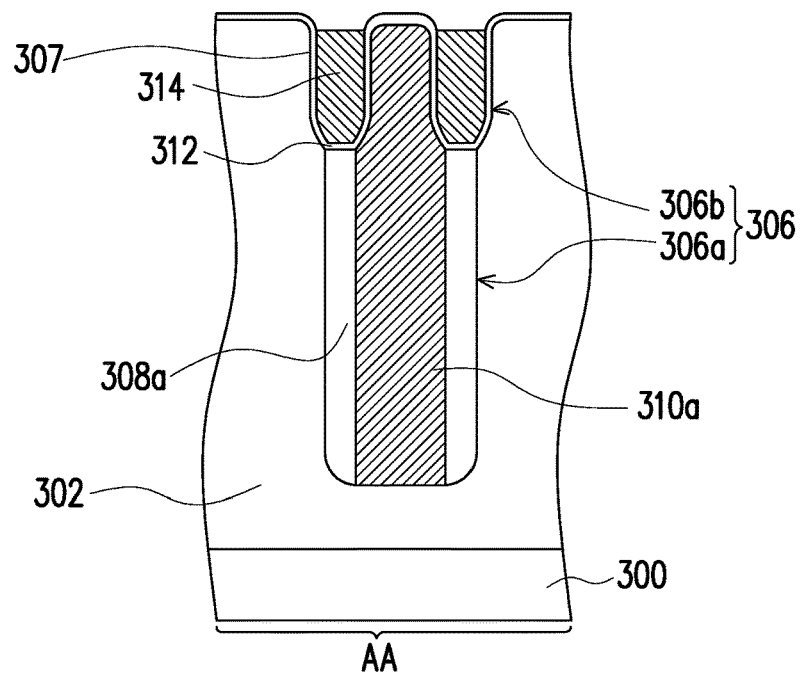

Referring to FIG. 4E, an interlayer insulating layer 312 is formed in the opening 311. More specifically, the interlayer insulating layer 312 covers the top surface of the epitaxial layer 102, the upper sidewall 307 of the trench 206, the top surface of the insulating liner 308a, and the top surface of the first conductive layer 310a. In an embodiment, the interlayer insulating layer 312 includes silicon oxide, and its formation method includes performing a chemical vapour deposition process. In this embodiment, the interlayer insulating layer 312 also serves as a gate dielectric layer.

Afterwards, a second conductive layer 314 is filled in the opening 311. In an embodiment, the second conductive layer 314 is a conductive layer of the first conductivity type, such as an N-type conductive layer. In an embodiment, the method of forming the second conductive layer 314 includes forming a second conductive material layer on the interlayer insulating layer 312. The second conductive material layer includes undoped polysilicon, and its formation method includes performing a chemical vapour deposition process. Then, an etching back process is performed to remove a portion of the second conductive material layer. Afterwards, an ion implantation process is performed to form an N-type heavily doped second conductive layer 314. In an embodiment, the interlayer insulating layer 312 is disposed between the second conductive layer 314 and the first conductive layer 310a and between the second conductive layer 314 and the insulating liner 308a.

Figure 4F:
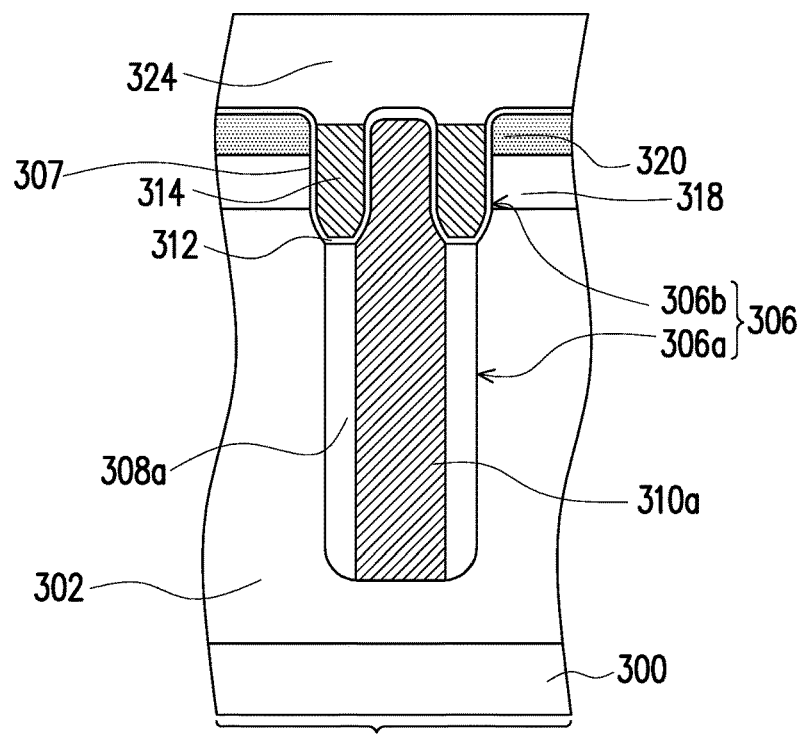

Referring to FIG. 4F, a body layer 318 is formed in the epitaxial layer 302. In an embodiment, the body layer 318 is a body layer of the second conductivity type, such as a P-type body layer, and its formation method includes performing an ion implantation process.

Afterwards, a doped region 320 is formed in the body layer 318. In an embodiment, the doped region 320 is a doped region of the first conductivity type, such as an N-type heavily doped region, and its formation method includes performing an ion implantation process.

Then, a dielectric layer 324 is formed on the second conductive layer 316. In an embodiment, the dielectric layer 324 includes silicon oxide, borophosphosilicate glass (BPSG), phosphosilicate glass (PSG), fluorosilicate glass (FSG) or undoped silicate glass (USG), and its formation method includes performing a chemical vapour deposition process.

Figure 4G:
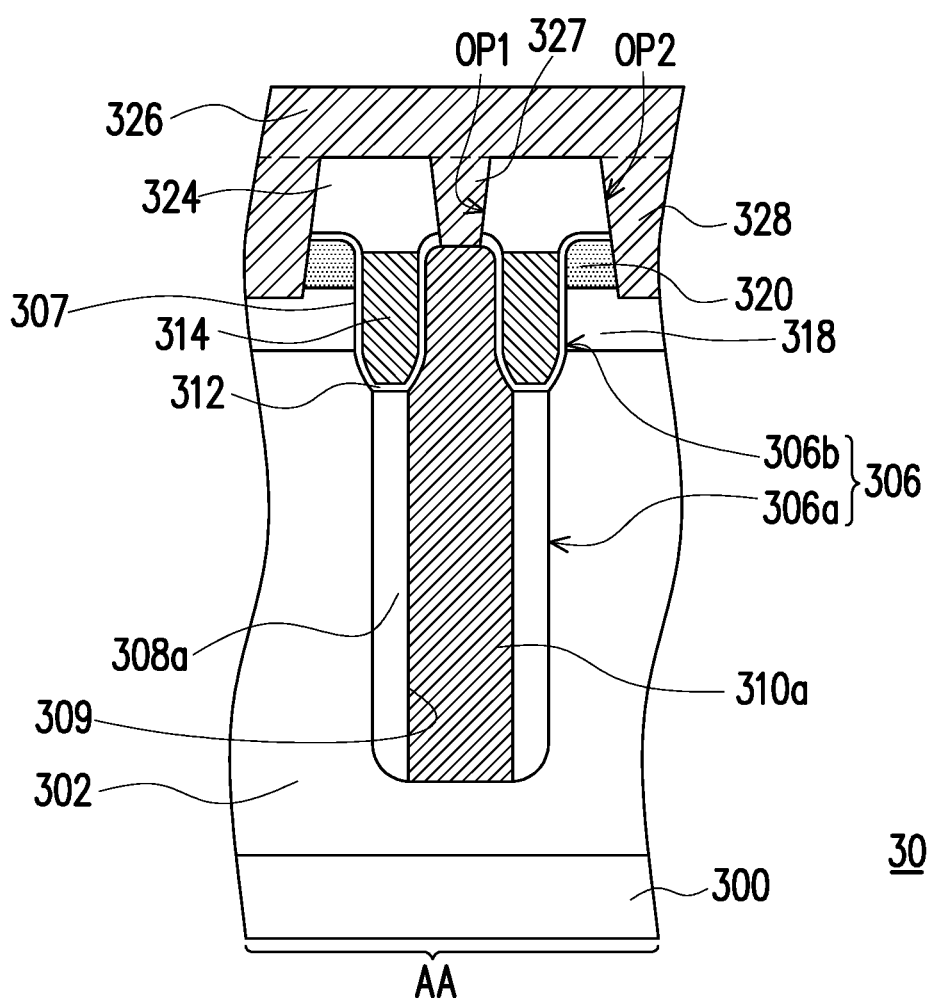

Referring to FIG. 4G, a first opening OP1 is formed through the dielectric layer 324 and the interlayer insulating layer 312, and a second opening OP2 is formed through the dielectric layer 324, the interlayer insulating layer 312 and the doped region 320. In this embodiment, the first opening OP1 and the second opening OP2 are located in the active area AA. The method of forming the openings includes performing photolithography etching processes. In an embodiment, upon the process requirements, the shape of each of the first opening OP1 and the second opening OP2 may include a strip shape, a block shape or a combination thereof.

Afterwards, a metal layer 326 is formed on the dielectric layer 324, and the metal layer 326 is filled into the first opening OP1 and the second opening OP2. Part of the metal layer 326 filled in the first opening OP1 constitutes a first contact plug 327, and part of the metal layer 326 filled in the second opening OP2 constitutes a second contact plug 328. The trench gate MOSFET 30 of the present invention is thus completed.

In the above embodiments, the first conductivity type is N-type and the second conductivity type is P-type. However, the present invention is not limited thereto. Persons having ordinary skill in the art should understand that, the first conductivity type can be P-type and the second conductivity type can be N-type.

Hereinafter, the structure of the trench gate MOSFET of the present invention will be described with reference to FIG. 1H, FIG. 2H, FIG. 3 and FIG. 4G.

In an embodiment, the trench gate MOSFET 10/20/30 includes a substrate 100/200/300 of a first conductivity type, an epitaxial layer 102/202/302 of the first conductivity type, and a first conductive layer 110/210/310a of a second conductivity type, a second conductive layer 116/216/314, and an interlayer insulating layer 112a/212a/312.

The epitaxial layer 102/202/302 is disposed on the substrate 100/200/300 and has at least one trench 106/206/306 therein. The first conductive layer 110/210/310a is disposed in the lower portion of the trench 106/206/306 and is in physical contact with the epitaxial layer 102/202/302.

In an embodiment, the doping concentration of the first conductive layer 110/310a is substantially uniform. However, the present invention is not limited thereto. In another embodiment, the doping concentration of the upper part 210b of the first conductive layer 210 is greater than the doping concentration of the lower part 210a of the first conductive layer 210.

In the present invention, there is no oxide layer at the bottom of the trench 106/206/306, so that the first conductive layer 110/210/310a is directly connected to the epitaxial layer 102/202/302 to form a PN junction at the bottom of the trench 106/206/306. In the present invention, the oxide in the trench does not have a minimum thickness limit, so it can be applied to a narrow pitch structure.

The second conductive layer 116/216/314 is disposed in the upper portion of trench 106/206/306. The interlayer insulating layer 112a/212a/312 is disposed between the first conductive layer 110/210/310a and the second conductive layer 116/216/314.

In an embodiment, the conductivity type of the second conductive layer 116/216/314 is opposite to the conductivity type of the first conductive layer 110/210/310. However, the present invention is not limited thereto. In another embodiment, the conductivity type of the second conductive layer 116/216/314 can be the same as the conductivity type of the first conductive layer 110/210/310.

In an embodiment, the trench gate MOSFET 10/20/30 further includes an insulating liner 108b/208b/308a disposed between the sidewall 109/209/309 of the first conductive layer 110/210/310a and the epitaxial layer 102/202/302.

In the present invention, the thin insulating liner 108b/208b/308a is provided on the sidewall of the trench 106/206/306, so as to prevent the dopant of the polysilicon doping process from diffusing to the epitaxial layer 102/202/302 beside the trench 106/206/306. Based on this structure, the epitaxial layer of the present invention can be provided with a higher doping concentration, thereby reducing the on-resistance (Ron).

In an embodiment, the trench gate MOSFET further includes a metal layer 126/226/326 disposed above the second conductive layer 116/216/314 and electrically connected to the first conductive layer 110/210/310a.

In an embodiment, as shown in FIG. 1H and FIG. 4G, the metal layer 126/326 is electrically connected to the first conductive layer 110/310a through the first contact plug 127/327 in the active area AA. In addition, the shape of the first contact plug 127/327 includes a stripe shape, a block shape or a combination thereof.

In an embodiment, as shown in FIG. 1H, the second conductive layer 116 is disposed on the upper sidewall 107 of the trench 106 and between the first contact plug 127 and the upper sidewall 107. In an embodiment, the trench gate MOSFET 10 further includes a mask layer 122 disposed between the second conductive layer 116 and the first contact plug 127.

In an embodiment, as shown in FIG. 4G, the second conductive layer 314 is disposed on the upper sidewall 307 of the trench 306 and surrounds the first conductive layer 310a. In an embodiment, the interlayer insulating layer 312 is further disposed between the second conductive layer 314 and the epitaxial layer 302.

In an embodiment, as shown in FIG. 2H and FIG. 3, the metal layer 226 does not physically contact the first conductive layer 210 in the active area AA. More specifically, the metal layer 226 is electrically connected to the upper part 210b of the first conductive layer 210 through the first contact plug 227 in the termination area TA. In addition, the shape of the first contact plug 227 includes a strip shape, a block shape or a combination thereof.

In the present invention, on the top of the first conductive layer 110/210/310a, a current dispersion structure (for example, the first contact plug 127/227/327) is directly connected to a source metal layer for dispersing current during operation of the device.

In an embodiment, as shown in FIG. 1H, FIG. 2H and FIG. 3, the trench gate MOSFET 10/20 further includes a dielectric layer 114/214 disposed between the second conductive layer 116/216 and the epitaxial layer 102/202 and between the second conductive layer 116/216 and the interlayer insulating layer 112a/212a.

In an embodiment, as shown in FIG. 1H and FIG. 2H, in the trench gate MOSFET 10/20, the top width is substantially equal to the bottom width of the trench 106/206. However, the present invention is not limited thereto. In another embodiment, as shown in FIG. 4G, in the trench gate MOSFET 30, the top width is greater than the bottom width of the trench 306.

In summary, in the trench gate MOSFET of the present invention, the bottom electrode (for example, the first conductive layer) is in physical contact with the epitaxial layer, and the conductivity types of the bottom electrode and the epitaxial layer are opposite so as to form a PN junction at the bottom of the trench. In addition, no thick oxide layer is formed at the bottom of the trench, so the trench size can be effectively reduced and the degree of integration of the device can be improved.

In addition, the metal layer is electrically connected to the bottom electrode through the current dispersion structure (for example, the first contact plug) in the active area or in the termination area, so that the current can be effectively dispersed during operation of the device. In other words, the potential line distribution of the structure of the present invention is relatively uniform, dense potential lines are not observed at the bottom of the trench, and the breakdown voltage (BVD) of the device is greatly increased. When the gate electrode of the present invention is turned on, current circulates not only through both sides of the trench, but also through the current dispersion structure in the trench, thereby lowering the on-resistance (Ron). In the structure of the present invention, the epitaxial layer and the polysilicon in the trench can exchange electrons in real time during operation; that is, the epitaxial layer, the polysilicon in the trench and the entire insulating layer on the trench sidewall form a large number of capacitors connected in parallel, so that a very small drain-to-source capacitance (Cds) can be obtained.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A trench gate MOSFET, comprising:
   an epitaxial layer of a first conductivity type, disposed on a substrate of the first conductivity type and having at least one trench;
   a first conductive layer of a second conductivity type, disposed in a lower portion of the trench and in physical contact with the epitaxial layer;
   a second conductive layer, disposed in an upper portion of the trench;
   an interlayer insulating layer, disposed between the first conductive layer and the second conductive layer; and
   a metal layer disposed over the second conductive layer and electrically connected to the first conductive layer,
   wherein the metal layer is electrically connected to the first conductive layer through a first contact plug located in the trench in an active area.

2. The trench gate MOSFET of claim 1, further comprising an insulating liner disposed between a sidewall of the first conductive layer and the epitaxial layer.

3. The trench gate MOSFET of claim 1, wherein the first contact plug has a strip shape, a block shape or a combination thereof.

4. The trench gate MOSFET of claim 1, wherein the second conductive layer is disposed on an upper sidewall of the trench and between the first contact plug and the upper sidewall.

5. The trench gate MOSFET of claim 1, further comprising a mask layer disposed between the second conductive layer and the first contact plug.

6. The trench gate MOSFET of claim 1, wherein the second conductive layer is disposed on an upper sidewall of the trench and surrounds the first conductive layer.

7. The trench gate MOSFET of claim 6, wherein the interlayer insulating layer is further disposed between the second conductive layer and the epitaxial layer.

8. The trench gate MOSFET of claim 1, further comprising a dielectric layer disposed between the second conductive layer and the epitaxial layer and between the second conductive layer and the interlayer insulating layer.

9. The trench gate MOSFET of claim 1, wherein a top width of the trench is substantially equal to a bottom width of the trench.

10. The trench gate MOSFET of claim 1, wherein a top width of the trench is greater than a bottom width of the trench.

11. A trench gate MOSFET, comprising:
    an epitaxial layer of a first conductivity type, disposed on a substrate of the first conductivity type and having at least one trench;
    a first conductive layer of a second conductivity type, disposed in a lower portion of the trench and in physical contact with the epitaxial layer;
    a second conductive layer, disposed in an upper portion of the trench;
    an interlayer insulating layer, disposed between the first conductive layer and the second conductive layer; and
    a metal layer disposed over the second conductive layer and electrically connected to the first conductive layer,
    wherein the metal layer does not physically contact the first conductive layer in an active area, and
    wherein the metal layer is electrically connected to an upper part of the first conductive layer through a first contact plug in a termination area.

12. The trench gate MOSFET of claim 11, wherein the first contact plug has a strip shape, a block shape or a combination thereof.

13. The trench gate MOSFET of claim 11, wherein a doping concentration of the upper part of the first conductive layer is greater than a doping concentration of a lower part of the first conductive layer.

* * * * *